United States Patent [19]
Lin

[11] Patent Number: 6,099,326
[45] Date of Patent: Aug. 8, 2000

[54] CONTACT FOR USE WITH MATRIX TYPE CONNECTOR

[75] Inventor: Yu-Hsu Lin, Fremont, Calif.

[73] Assignee: Hon Hai Precision Ind. Co., Ltd., Taipei Hsien, Taiwan

[21] Appl. No.: 09/154,667

[22] Filed: Sep. 18, 1998

[51] Int. Cl.[7] .................................................. H01R 12/00
[52] U.S. Cl. .............................................. 439/83; 439/70
[58] Field of Search ............................. 439/83, 78, 55, 439/80, 81, 82, 876, 874, 875; 29/860

[56] References Cited

U.S. PATENT DOCUMENTS

| | | | |
|---|---|---|---|
| 5,489,218 | 2/1996 | McHugh | 439/342 |
| 5,746,608 | 5/1998 | Taylor | 439/70 |

*Primary Examiner*—Lincoln Donovan
*Assistant Examiner*—Michael C. Zarroli
*Attorney, Agent, or Firm*—Wei Te Chung

[57] ABSTRACT

A matrix type connector (10) vertically defines a plurality of passageways (14) therethrough for receiving a plurality of contacts (16) therein. Each contact (16) includes a base (18) with retention means (20) formed thereon for retaining the contact (16) in the corresponding passageway (14). A contact section (28) extends upward from the base for engagement with a corresponding pin of a CPU. A tail section (30) extends downward from the base (18). An upper portion of the tail section (30) is twisted whereby the remaining portion thereof is positioned at a angle with regard to the base (18), a crook (38) is formed on a middle portion thereof, and a bowl-shaped solder section (40) is formed on a bottom portion thereof. Thus, the connector (10) can be fastened to the mother board (100) on which it is seated by means of a combination of the bowl-shaped solder section (40) and the corresponding solder paste (102) of the mother board (100).

16 Claims, 3 Drawing Sheets

CONTACT FOR USE WITH MATRIX TYPE CONNECTOR

BACKGROUND OF THE INVENTION

1. Field of the Invention

The invention relates to a matrix type connector, and particularly to contacts used with a matrix type connector.

2. The Related Art

All personal computers require a CPU. To conveniently access the CPU for replacement and/or repair, a socket is generally provided to function as an intermediate device between a mother board and the CPU, wherein the socket is permanently mounted to the mother board while the CPU is detachably received within the socket.

A traditional socket is of a PGA (Pin Grid Array) type which includes a plurality of contacts in a matrix arrangement each having a pin type tail to be receivably soldered into a corresponding hole defined in the mother board, as disclosed in U.S. Pat. No. 5,489,218 which has the same assignee as the present invention. Such practice is implemented through a wave soldering process for mounting the socket onto the mother board, while recently SMT (Surface Mount Technology) has become a common method of assembly. Thus, an SMT process can be used to solder a BGA (Ball Grid Array) type connector to a mother board wherein each of a plurality of contacts of the socket in a matrix arrangement includes a solder ball attached to a lower tip thereof. Therefore, the BGA socket can be positioned on the mother board under the condition that the socket ball of each contact is seated on a corresponding paste on the mother board. The contact can then be fastened to the mother board by means of a combination of the solder ball and the corresponding paste through a reflow process.

The BGA arrangement for SMT is originally developed by IC chip packaging manufacturers. The material of the chip should be in compliance with that of the mother board to ensure that the solder joint between the solder ball and the paste will not break due to different CTEs (Coefficient of Thermal Expansion) between the mother board and the IC chip package during a high internal temperature operation of the computer.

Unfortunately, the connector is generally made by injection molding, thus, it is difficult to obtain a connector and a mother board with a similar CTE. Recently, the BGA type socket has been developed using BGA technology of the IC chip package, however, BGA sockets are not popular due to unreliability and a high defect ratio.

Therefore, an object of the present invention is to provide a contact arrangement for use with a matrix type connector adapted to be assembled to a mother board using an SMT process and having advantages of high reliability, low defect ratio and ease of assembly.

SUMMARY OF THE INVENTION

According to an aspect of the present invention, a matrix type connector vertically defines a plurality of passageways therethrough for receiving a plurality of contacts therein. Each contact includes a base with retention means formed thereon for retaining the contact in the corresponding passageway. A contact section extends upward from the base for engagement with a corresponding pin of a CPU. A tail section extends downward from the base. An upper portion of the tail section is twisted whereby the remaining portion thereof is positioned at a angle with regard to the base, a crook is formed on a middle portion thereof, and a bowl-shaped solder section is formed on a bottom portion thereof. Thus, the connector can be fastened to the mother board on which it is seated by means of a combination of the bowl-shaped solder section and the corresponding solder paste of the mother board.

DETAILED DESCRIPTION OF THE PREFERRED EMBODIMENTS

References will now be made in detail to the preferred embodiment of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
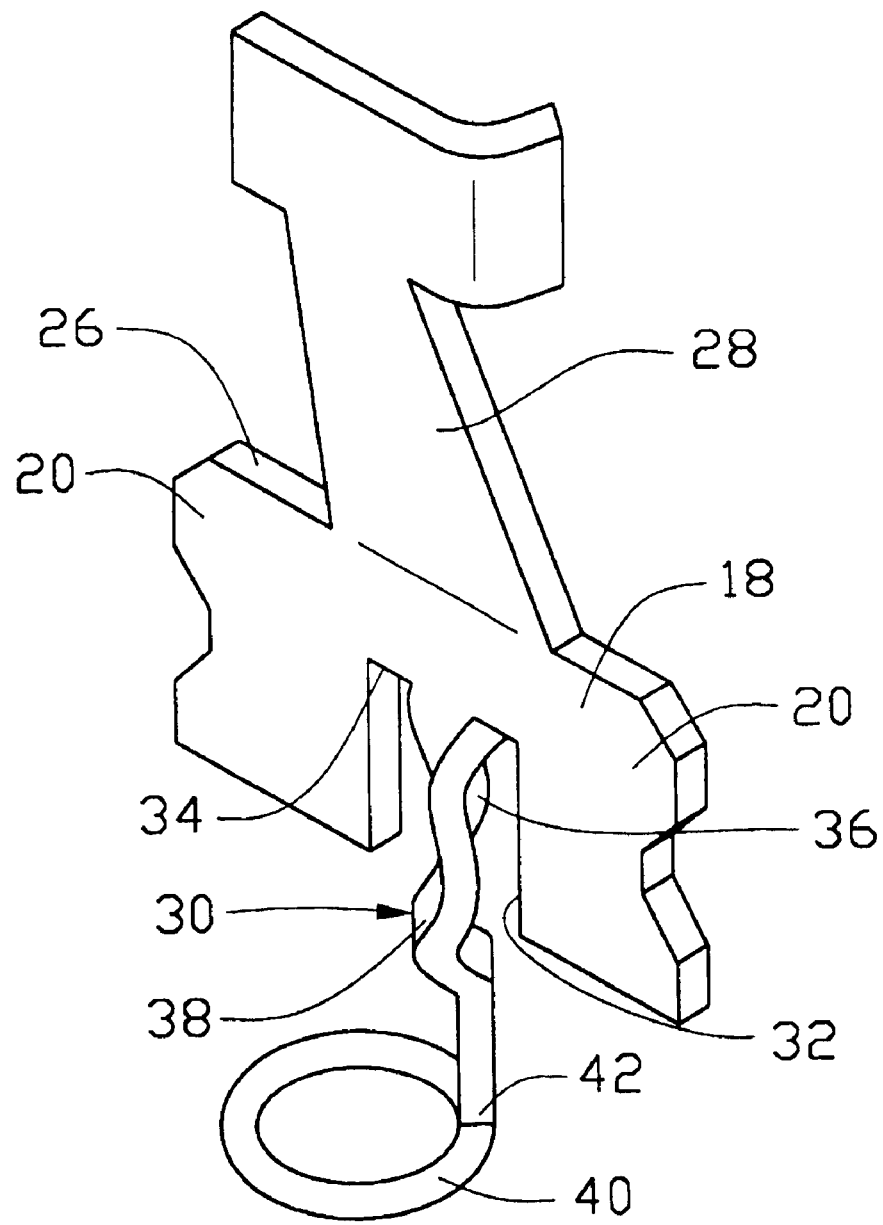
FIG. 1 is an enlarged partial perspective view of a presently preferred embodiment of a contact for use with a matrix type connector in accordance with the present invention.
Figure 2:
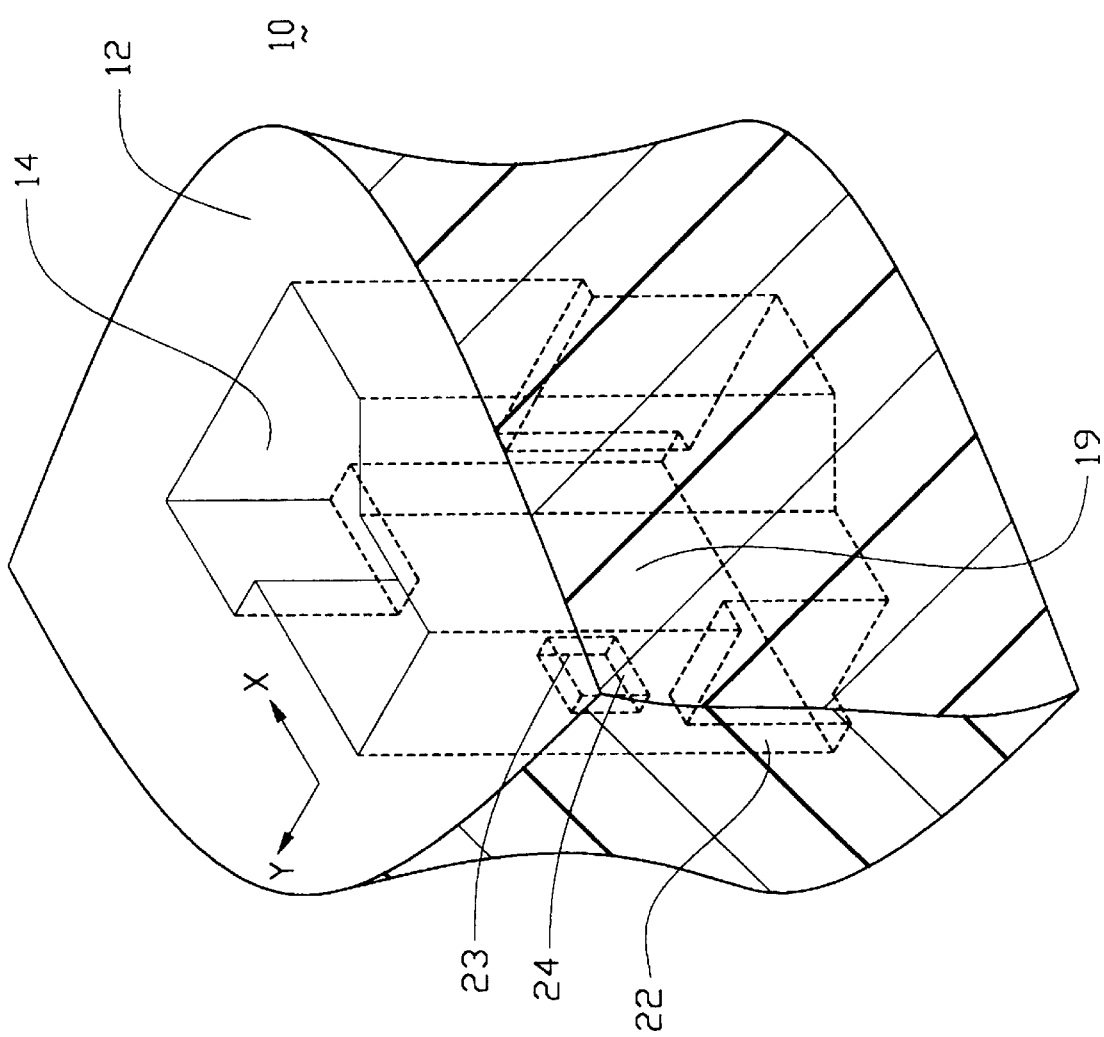
FIG. 2 is an enlarged partial perspective view of a matrix type connector adapted to be used with the contact of FIG. 1.
Figure 3:
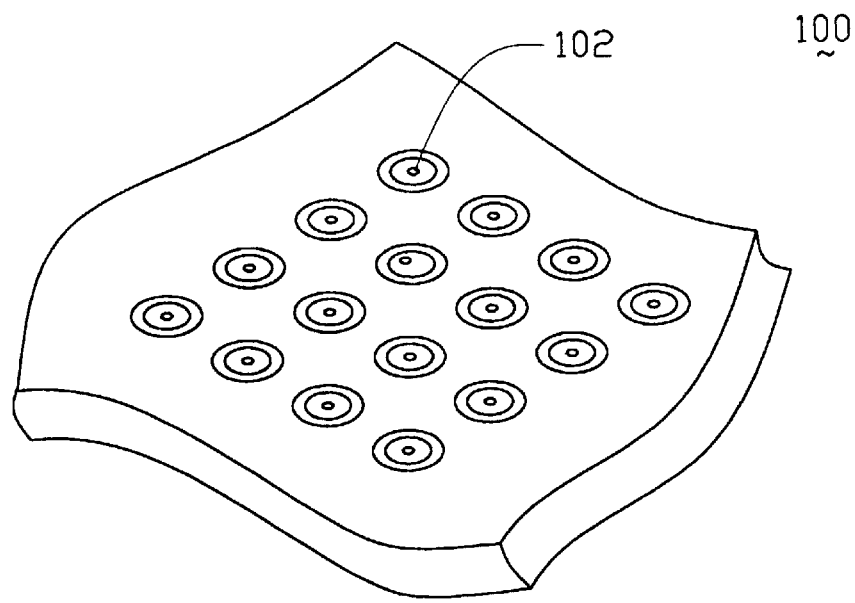
FIG. 3 is an enlarged fragmentary perspective view of a mother board with matrix type solder pastes thereon for use with the connector of FIG. 2.

It will be noted here that for a better understanding, most of like components are designated by like reference numerals throughout the various figures in the embodiments. Attention is directed to FIGS. 1–3 wherein a matrix type PGA socket 10 includes an insulative housing 12 defining a plurality of passageways 14 (only one shown) each receiving a contact 16 (only one shown) therein. The structure of the socket and how the contacts are received therein and the application of the connector may be referred to the aforementioned U.S. Pat. No. 5,489,218.

Each contact 16 includes a base 18 with barbs 20 formed on lateral sides thereof for interferential engagement within a pair of slots 22 defined in the passageway 14. A block 23 with a step 24 is formed in the passageway 14 for abutting against the upper face 26 of the base 18 and preventing upward movement of the contact 16.

A contact section 28 upwardly extends from the base 18 for engagement with the corresponding pin of the CPU (not shown) inserted into the passageway 14. Oppositely, a tail section 30 downwardly extends from the base 18. To increase the resiliency of the tail section 30, a large indent 32 is formed in the base 18 and the tail section 30 extends downward from an undersurface 34 above the indent 32 to achieve an extended length thereof.

For efficient performance, the tail section 30 includes three features. Firstly, a twist section 36 is formed on the upper portion thereof for connecting to the base 18 so that the remaining portions thereof are generally disposed at an angle relative to the base 18, thereby compromising the deflection requirements along both X and Y axes in a horizontal plane of the housing 12 of the socket 10 which will be illustrated in more detail later. Secondly, a crook section 38 is formed on the middle portion of the tail section 30 to absorb some of the excessive displacement of the tail section 30 which will also be illustrated in more detail later. Thirdly, an upward-facing bowl section 40 is formed on a lower tip 42 of the tail section 30 for solderably engaging with the corresponding solder paste 102 of the mother board 100 on which the socket 10 is seated.

When the socket 10 is assembled to the mother board 100, the housing 12 can be retainably mounted thereto by means of metal holddowns or plastic posts (not shown) hooked on or interfering with the mother board 100. By means of locating tools, the socket 10 is firmly held on the mother board 100 and the bowl section 40 applies a light force on the corresponding solder paste 102 of the mother board 100, whereby the crook section 38 absorbs some of the excessive displacement of the bowl section 40 due to coplanarity differences among individual contacts 16. The bowl section 40 of each contact 16 can then be combined with the corresponding solder paste 102 through a reflow procedure.

When the socket 10 is soldered to the mother board 100, the tail sections 30 may provide flexibility to absorb possible deflection of the contact 16 due to CTE (Coefficient of Thermal Expansion) differences between the housing 12 of the socket 10 and the mother board 100. Since the main portion of the tail section 30 is disposed at an angle relative to the base 18, for example, 45 degrees, it can efficiently compromise the deflections along the direction of both X and Y axes.

Additionally, the spherical surface 44 of the bowl section 40 generally provides an expectable, controllable and reliable solder joint with the solder paste 102 of the mother board 100, and especially with the BGA type solder paste which is designed to be use with a BGA type socket. It should be noted that other types of soldering portions such as butt, J-type, gull-wing, etc., can also be used. Furthermore, a coating of tin/lead is plated on the surface of the bowl section 40 for providing a good connection with the mother board 100 while a coating of nickel is plated on the remaining portion of the contact 16 for providing protection from wicking during a reflow procedure.

It can be appreciated that even though SMT type contacts can be found in other types of connectors, such as a PLCC or card edge connector, the matrix type connector previously utilized either conventional through hole pin type contacts for a traditional wave soldering procedure, or the BGA type contacts for an SMT/reflow procedure for being soldered to the corresponding mother board. The present invention is the first to disclose a matrix type connector adapted to be soldered to a mother board through SMT without necessitating the installation of solder balls to contacts. It is also seen the solder portions, i.e., the bowl portions 40, all extend toward the same direction in a horizontal plane, thus resulting in a compact organized arrangement thereof to comply with the dense matrix type solder paste 102 on the mother board 100, while the traditional SMT type contact tails used in the aforementioned PLCC or card edge connectors, generally extend toward different directions for easy inspection of soldering. It should be understood that using BGA technology is time and cost inefficient because each solder ball below the lower tip of the contact must be individually installed by a high precision machine. As previously mentioned, the solder balls of the BGA connector may become easily damaged due to the rigidity thereof confronting CTE differences between the housing and the mother board.

Figure 4A:
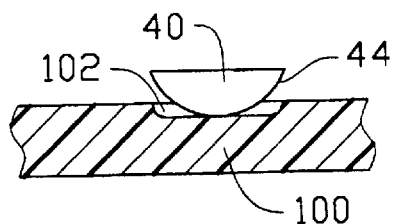
FIG. 4(A) is an enlarged cross-sectional view of the mother board and a bowl section of the contact to show the engagement between the bowl section of the contact and the BGA type solder pastes on the mother board in an upright manner.
Figure 4B:
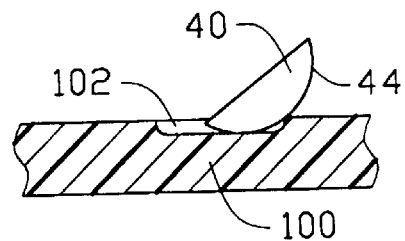
FIG. 4(B) is an enlarged cross-sectional view of the mother board of FIG. 3 and a bowl section of the contact of FIG. 1 to show the engagement between the bowl section of the contact and the BGA type solder pastes on the mother board in an oblique manner.

The present invention can utilize pin type contacts directly soldered to the mother board 100 by SMT, thereby not only saving time and money but also preventing damage to the solder balls. The flexibility of the tail section 30 effectively accommodates a mother board and a housing 12 having different CTEs, thereby eliminating the concern of CTE mismatch. The spherical surface 44 of the bowl section 40 also promotes use of the socket 10 with the mother board which was originally adapted to be used solely with the BGA type socket. FIGS. 4(A) and 4(B) show the spherical surface 44 may assure the engagement with the BGA type solder paste 102 even in an oblique manner.

The advantages of the invention include ease of manufacture and assembly, simple design, good controllable quality, low profile, reduced cost, reliable solder joint, less CTE concern, improved shock and vibration performance, and no wicking concern. It should be noted that even though the invention is disclosed to be used in a socket, such arrangement can also be used with an IC package. It is also noted that the barbs 20 may designed to function in either a fixed or floating manner for variant applications of the contact 18.

In this embodiment, the base 18 generally abuts against the wall 19 by the passageway 14, and thus the contact section 28 and the bowl section 40 both projects toward the center of the passageway along the same side/direction relative to the base 18 for obtaining a better mechanical operation of the whole contact 16. Additionally, the crook section 38 also directs toward the same side/direction with the contact section 28 and the bowl section 40.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

What is claimed is:

1. A socket comprising:
   an insulative housing defining a plurality of matrix type passageways extending therethrough in a vertical direction;
   a plurality of contacts received within the passageways, respectively;
   each of said contacts including a base with retention means for retainable engagement within the housing, a contact section upward extending from the base, a tail section downward extending from the base, and a solder portion horizontally extending from a bottom tip of the tail portion for surface mounting to a corresponding solder paste on a mother board in a reflow process, the tail section including a twisted section around an upper portion for providing flexibility in both X and Y directions in a horizontal plane.

2. The socket as defined in claim 1, wherein the solder portion is of a bowl-like configuration to provide a spherical surface thereon.

3. The socket as defined in claim 1, wherein the base abuts against a wall around the passageway.

4. The socket as defined in claim 3, wherein the solder portion extends toward a center of the corresponding passageway.

5. The socket as defined in claim 1, wherein said tail section of each of said contacts includes a crook section around a middle portion for absorb excessive displacement of the solder portion due to different coplanarity among the bowl portions of the tail sections of the contacts.

6. The socket as defined in claim 1, wherein an indent is formed in the base of each of said contact, and the corresponding tail section extends downward from an undersurface of the base above said indent to lengthen itself for better resiliency.

7. A socket comprising:

an insulative housing defining a plurality of passageways in a matrix arrangement;

a number of contacts received within the corresponding passageways, respectively;

each of said contacts including a base interferentially positioned within a corresponding passageway of the housing; a contact section extending upward from the base toward a center of the passageway; and a tail section extending downward from the base, and a solder portion extending from a bottom tip of the tail section in a horizontal direction, the solder portion also extending toward a center of the passageway.

8. An electrical assembly for connecting to an IC package, comprising:

a mother board with a plurality of solder pastes thereon in a matrix arrangement;

a socket including a housing defining a plurality of passageways extending therethrough in a vertical direction;

a plurality of contacts received within the passageways, respectively;

each of said contacts including a contact section extending upward for engagement with a corresponding pin of the IC package, a tail section extending downward, a twisted section being formed around an upper portion of the tail section for providing the contact with flexibility in both X and Y directions in a horizontal plane; wherein a solder portion formed at a bottom tip of the tail section, extends in a horizontal direction so as to comply with corresponding matrix type solder pastes on the mother board for soldering.

9. An arrangement for compensating for thermal mismatch between a housing of a socket and a mother board, comprising:

a socket comprising a housing defining a plurality of passageways therein;

a number of contacts received within the corresponding passageways of the housing, respectively;

each of said contacts including a base extending horizontally in a first direction and vertically in a second direction, a tail section extending downward from the base at an angle relative to the plane of the base, a solder portion extending horizontally form a bottom tip of the tail section for being soldered to the mother board.

10. An arrangement of absorbing excessive displacement of a SMT type contact of the socket due to coplanarity issues, comprising:

a socket comprising housing;

a plurality of passageways extending through the housing in a vertical direction;

a number of contacts received within the corresponding passageways, respectively;

each of said contacts including a base, from which a tail section extends downward wherein a solder portion extends horizontally from a bottom tip of the tail section and a crook section is formed on a middle portion of the tail section.

11. The arrangement as defined in claim 10, wherein the base includes an indent and the tail section extends downward from an undersurface above said indent.

12. A socket for use with a mother board with a plurality of matrix type solder pastes thereon, comprising:

an insulative housing defining a plurality of passageways extending therethrough in a vertical direction;

a plurality of contacts received within the corresponding passageways, respectively;

each of said contacts including a base, a contact section extending upward from the base for engagement with a pin of a CPU inserted into the corresponding passage from the top, and a tail section extending downward from the base; wherein the tail sections of said contacts include solder portions extending horizontally from bottom tips thereof, respectively, in a same direction, to form a dense and compact matrix arrangement in compliance with the solder pastes on the mother board, a crook section being formed around a middle portion of the contact for absorbing excessive displacement of the solder portion thereof due to different coplanarity among the tail sections of the contacts.

13. A contact for being mounted to a mother board in reflow procedure, comprising:

a base with retention means thereon;

a contact section extending upward from the base;

a tail section extending downward from the base, and being twisted at an angle relative to the base; and a solder portion extending horizontally from a bottom tip of the tail section.

14. The contact as defined in claim 13, wherein the tail section includes a crook section along a lengthwise direction thereof.

15. The contact as defined in claim 13, wherein the contact section and the solder portion extend toward opposite sides of the base.

16. A socket comprising:

an insulative housing defining a plurality of matrix type passageways extending therethrough in a vertical direction;

a plurality of contacts received within the passageways, respectively;

each of said contacts including a base with retention means for retainable engagement within the housing, a contact section upward extending from the base, a tail section downward extending from the base, and a solder portion horizontally extending from a bottom tip of the tail portion for surface mounting to a corresponding solder paste on a mother board in reflow process, wherein the tail section of each of said contacts includes a crook section around a middle portion for absorbing excessive displacement of the solder portion due to different coplanarity among the tail sections of the contacts.

* * * * *